(12) United States Patent  (10) Patent No.: US 7,432,147 B2
Akasaka  (45) Date of Patent: Oct. 7, 2008

(54) METHOD OF MANUFACTURING SEMICONDUCTOR DEVICE

(75) Inventor: Yasushi Akasaka, Ibaraki-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 452 days.

(21) Appl. No.: 11/318,479

(22) Filed: Dec. 28, 2005

(65) Prior Publication Data

US 2006/0166427 A1 Jul. 27, 2006

(30) Foreign Application Priority Data

Dec. 28, 2004 (JP) ............................. 2004-381251

(51) Int. Cl.
*H01L 21/8238* (2006.01)
(52) U.S. Cl. ............................... 438/216; 257/E21.637
(58) Field of Classification Search ................. 438/216, 438/228, 926; 257/E21.204, E21.637
See application file for complete search history.

(56) References Cited

U.S. PATENT DOCUMENTS 6,483,151 B2* 11/2002 Wakabayashi et al. ...... 257/369
6,492,217 B1* 12/2002 Bai et al. .................... 438/199
6,727,130 B2* 4/2004 Kim et al. ............ 257/E21.637

FOREIGN PATENT DOCUMENTS

JP         7-221193        8/1995
JP       2002-289700      10/2002
JP       2003-045995       2/2003

OTHER PUBLICATIONS

Samavedam et al., "Dual-Metal Gate CMOS with $HfO_2$ Gate Dielectric", IEEE, IEDM Technical Digest, pp. 433-436, (2002).
Notification of Reason(s) for Refusal issued by the Japanese Patent Office on May 30, 2008, for Japanese Patent Application No. 2004-381251, and English-language translation thereof.

* cited by examiner

*Primary Examiner*—Chandra Chaudhari
(74) *Attorney, Agent, or Firm*—Finnegan, Henderson, Farabow, Garrett & Dunner, L.L.P.

(57) ABSTRACT

A method of manufacturing a semiconductor device comprises: forming a device isolation, a first conductivity type region, and a second conductivity type region on a semiconductor substrate; depositing a gate insulating film on an entire surface of the semiconductor substrate; forming a first metal film on the gate insulating film; forming a region of a second metal film so as to cover a region that forms a gate electrode of the first conductivity type region; removing the first metal film exposed outside the region of the second metal film by wet etching to expose the gate insulating film; forming a third metal film on the entire surface of the semiconductor substrate; depositing a protecting film on the third metal film; and patterning the first metal film, the second metal film, the third metal film, and the protecting film to form the gate electrode.

20 Claims, 10 Drawing Sheets

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2004-381251, filed on Dec. 28, 2004; the entire contents of which are incorporated herein by reference.

BACKGROUND OF THE INVENTION

1. Field of the Invention

This invention relates to a method of manufacturing a semiconductor device, and more particularly to a method of manufacturing a semiconductor device including an improved process of manufacturing a gate electrode of a MIS-FET for use, for example, in an LSI.

2. Background Art

Figure 9A:
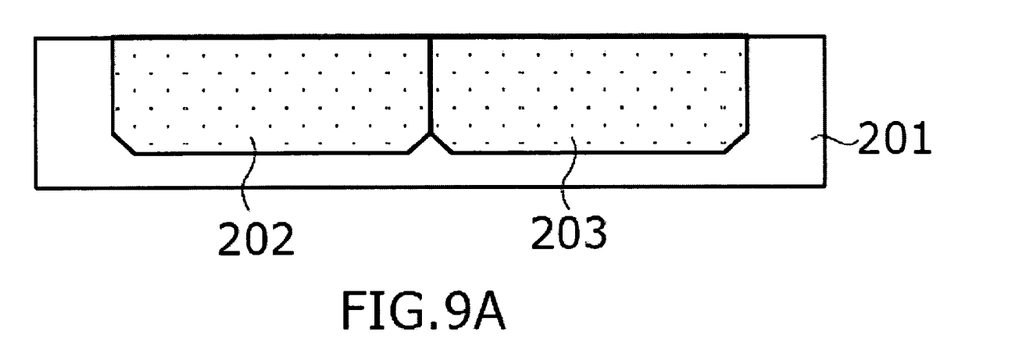
FIGS. 9 and 10 are process cross-sectional views in a patterning process investigated by the inventors in the course of reaching the invention.

In general, as shown in FIG. 9A, a method of manufacturing a MOSFET includes forming an N-well region 202 and a P-well region 203 in a silicon substrate 201 (e.g., S. B. Samavedam et al., IEDM Technical digest, 2002, p. 433).

Figure 9B:
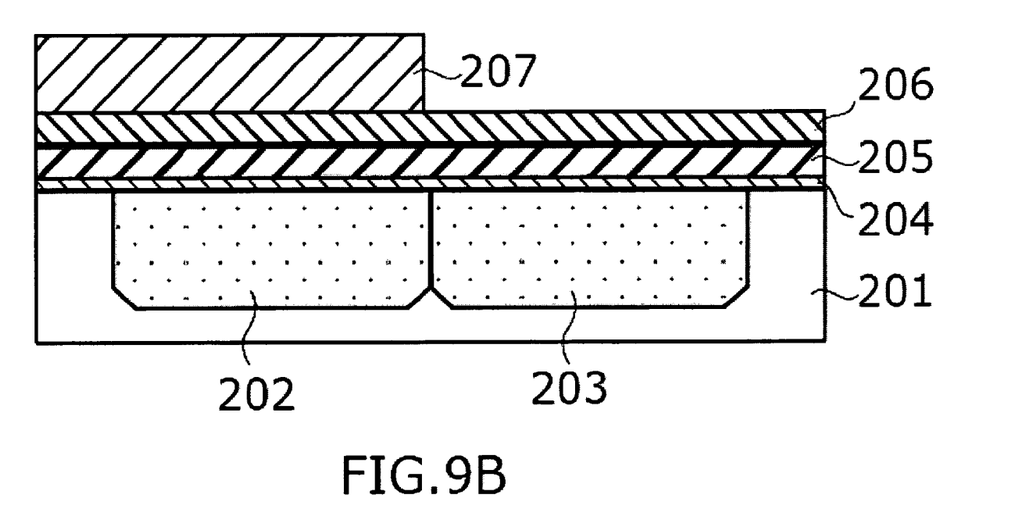
Figure 10A:
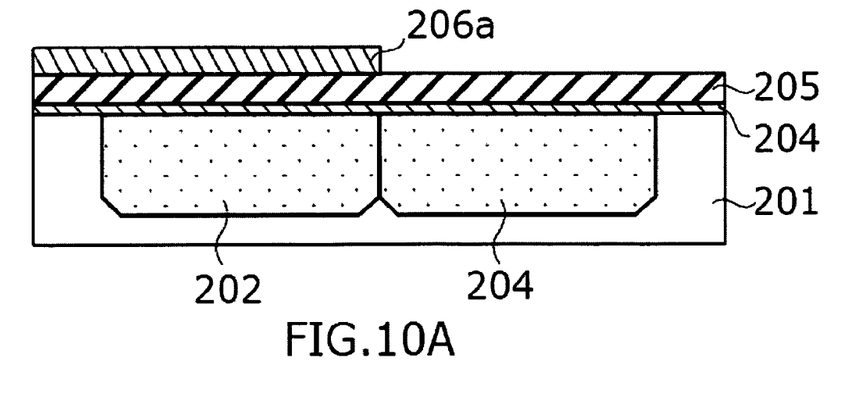

Next, as shown in FIG. 9B, a $HfO_2$ film 204 is deposited thereon as a gate insulating film. TiN 205 is deposited as a first gate electrode material and a silicon oxide film 206 is deposited as an etch mask material. A resist mask 207 is formed by using a P-well mask. As shown in FIG. 10A, the silicon oxide film on the NMIS region is removed to form a silicon oxide film hard mask 206A.

Figure 10B:
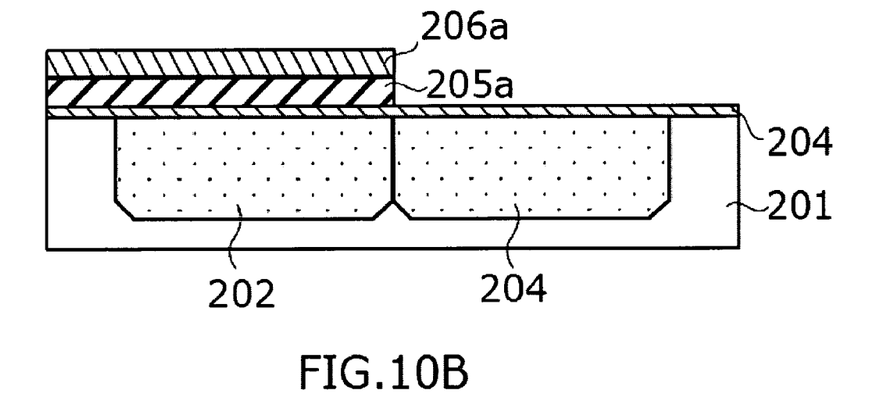
Figure 10C:
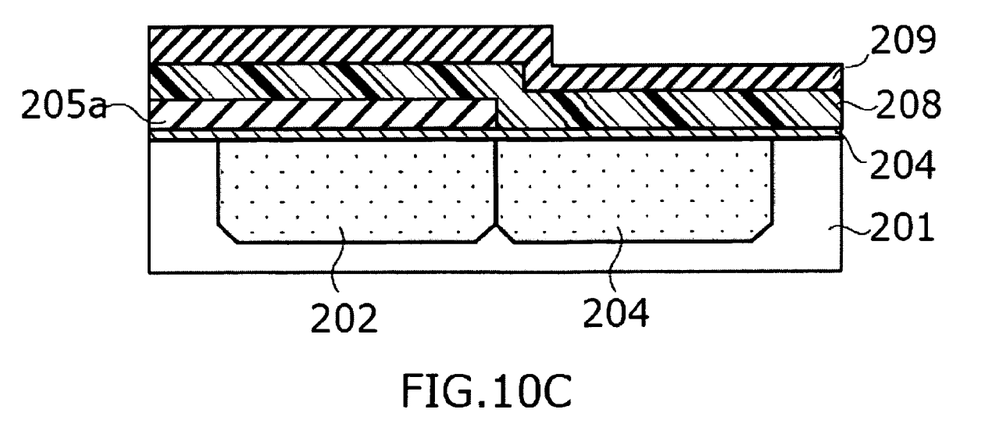

Next, as shown in FIG. 10B, the exposed TiN is removed by wet etching. As shown in FIG. 10C, the silicon oxide film hard mask 206A is removed using HF. A TaSiN film 208 is deposited as a second gate electrode material on the entire surface of the wafer. Further thereon, a poly-Si film 209 is deposited on the entire surface of the wafer.

Subsequently, although not shown in Samavedam et al., conventional processes are used to produce a MIS-FET by patterning a gate electrode, forming an extension, gate sidewall, and source/drain, and forming interconnection.

In a MIS-FET manufactured by the above method, different kinds of metal gates can be formed in the NMOS and PMOS regions on the substrate surface. However, since the hard mask is formed from a silicon oxide film, its removal requires etching with HF-containing liquid. In this situation, while $HfO_2$ having nearly normal composition is unlikely to be etched, a $SiO_2$-based or $HfSiO_x$-based gate insulating film will be etched by HF. Therefore the above method is not applicable.

As described above, in the conventional method, since the hard mask is formed from a silicon oxide film, its removal requires etching with HF-containing liquid. In this situation, there is a problem that the above method is not applicable because a $SiO_2$-based or $HfSiO_x$-based gate insulating film will be etched by HF.

SUMMARY OF THE INVENTION

According to an aspect of the invention, there is provided a method of manufacturing a semiconductor device comprising: forming a device isolation, a first conductivity type region, and a second conductivity type region on a semiconductor substrate; depositing a gate insulating film on the semiconductor substrate; forming a first metal film on the gate insulating film; forming a region of a second metal film so as to cover a region that forms a gate electrode of the first conductivity type region; removing the first metal film exposed outside the region of the second metal film by wet etching to expose the gate insulating film; forming a third metal film on the second metal film and on the exposed gate insulating film; depositing a protecting film on the third metal film; and patterning the first metal film, the second metal film, the third metal film, and the protecting film to form the gate electrode.

According to other aspect of the invention, there is provided a method of manufacturing a semiconductor device comprising: forming a device isolation, a first conductivity type region, and a second conductivity type region on a semiconductor substrate; forming a first dummy gate in a region that forms a gate electrode of the first conductivity type and a second dummy gate in a region that forms a gate electrode of the second conductivity type on the semiconductor substrate; forming gate sidewalls made of insulator on both sides of the first and second dummy gates; covering the region other than the first and second dummy gates on the semiconductor substrate; selectively removing the first and second dummy gates with the gate insulating film and the gate sidewalls being covered; forming a gate insulating film on a surface of the semiconductor substrate exposed by removal of the first and second dummy gates; forming a first metal film on the gate insulating film; forming a second metal film on the first metal film; removing the second metal film in the region having the second dummy gate formed therein while the second metal film is covered in the region having the first dummy gate formed therein; removing, by wet etching, the first metal film in the region having the second dummy gate formed therein while the first metal film is covered thereon with the second metal film in the region having the first dummy gate formed therein, thereby exposing the gate insulating film; forming a third metal film at least on the gate insulating film exposed in the region having the second dummy gate formed therein; and removing the first metal film, the second metal film and the third metal film except the regions having the first and second dummy gates formed therein.

According to other aspect of the invention, there is provided a method of manufacturing a semiconductor device comprising: a method of manufacturing a semiconductor device including a semiconductor layer having a first conductivity type region and a second conductivity type region formed therein, a gate insulating film formed on the semiconductor layer, a first gate electrode provided on the gate insulating film in the first conductivity type region, and a second gate electrode provided on the gate insulating film in the second conductivity type region, the first gate electrode having a first metal film provided on the gate insulating film and a second metal film provided on the first metal film, and the second gate electrode having a third metal film provided on the gate insulating film, the method comprising: forming the first metal film on the gate insulating film; removing, by wet etching, the first metal film in the region where the second gate electrode is formed while the first metal film is covered with the second metal film in the region where the first gate electrode is formed; and forming a third metal film at least in the region where the second gate electrode is formed.

DETAILED DESCRIPTION OF THE INVENTION

Embodiments of the invention will now be described with reference to the drawings.

First Embodiment

Figure 2A:
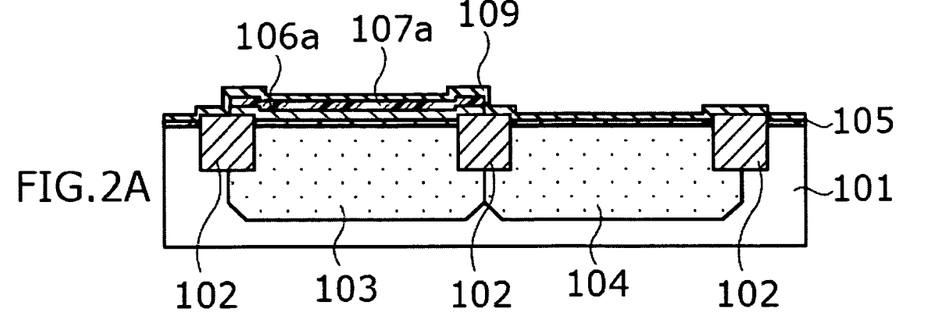
Figure 2B:
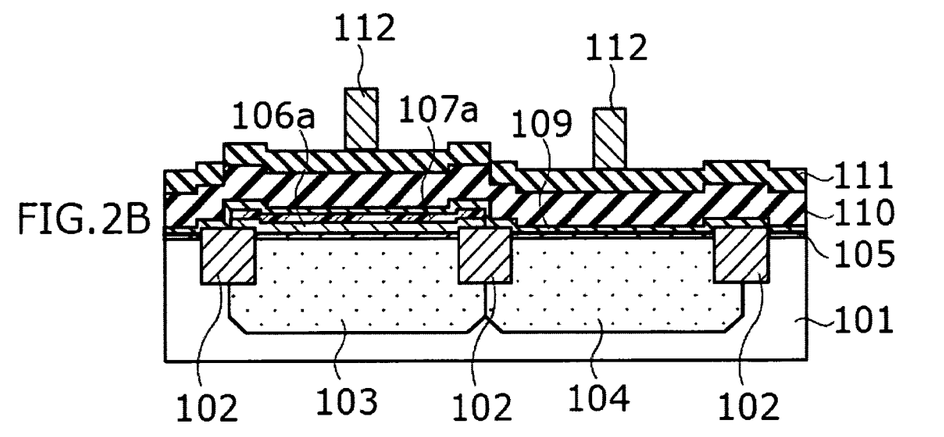
Figure 2C:
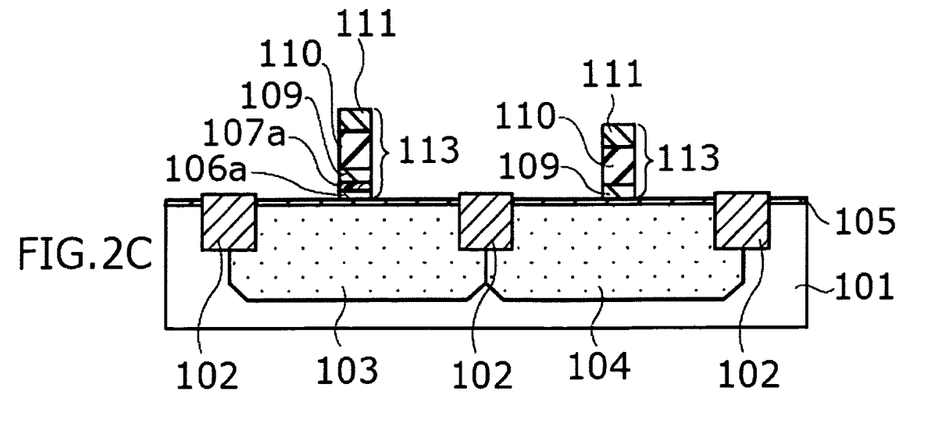
Figure 3:
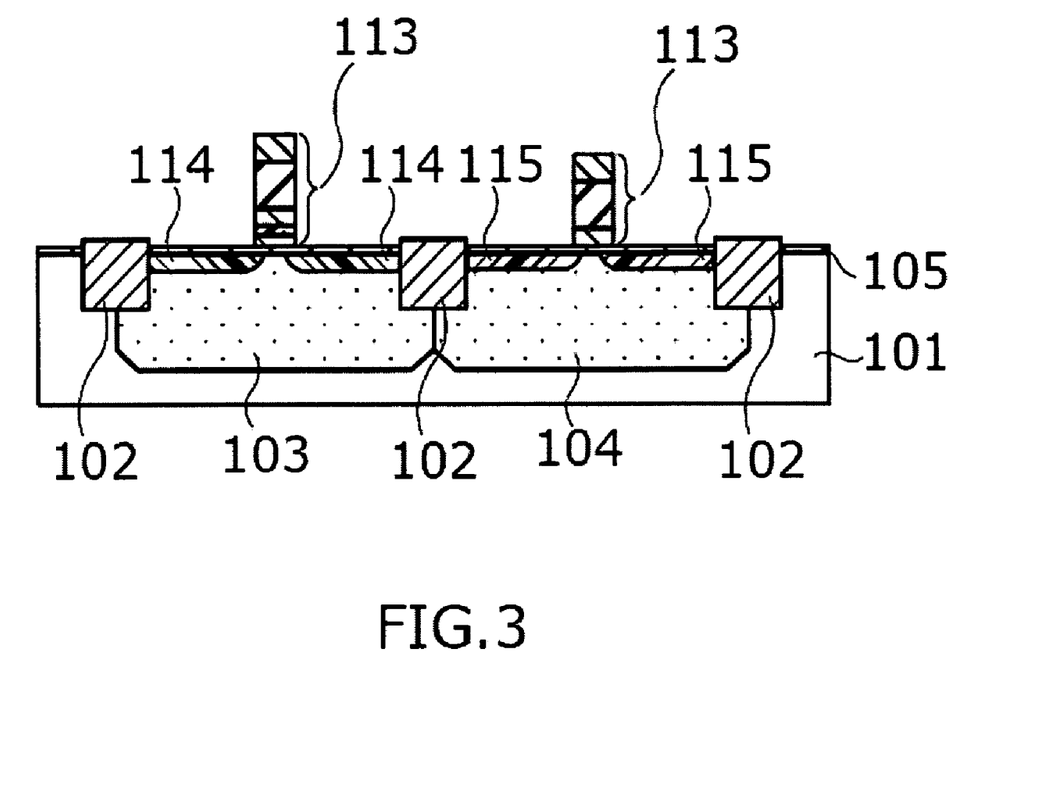

FIGS. 1 to 3 are process cross-sectional views illustrating the relevant part of a method of manufacturing a semiconductor device according to a first embodiment of the invention.

Figure 1A:
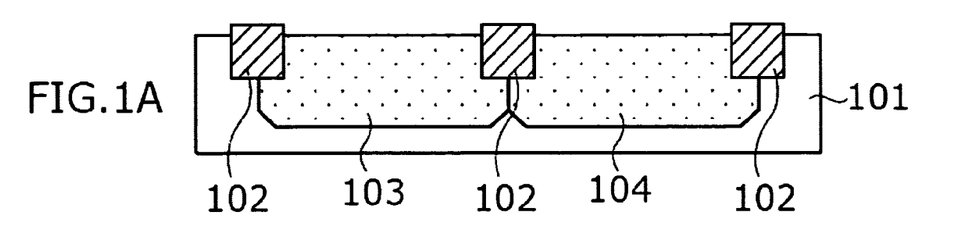
FIGS. 1 to 3 are process cross-sectional views illustrating the relevant part of a method of manufacturing a semiconductor device according to a first embodiment of the invention.

First, as shown in FIG. 1A, a device isolation 102, an N-well region 103, and a P-well region 104 are formed in a silicon substrate 101. Specifically, the device isolation 102 can be formed by oxidizing part of the silicon substrate 101 or by forming a trench and filling it with insulator. The N-well region 103 can be formed by selectively introducing n-type impurities into the surface of the silicon substrate 101, and the P-well region 104 can be formed by selectively introducing p-type impurities into the surface of the silicon substrate 101.

Figure 1B:
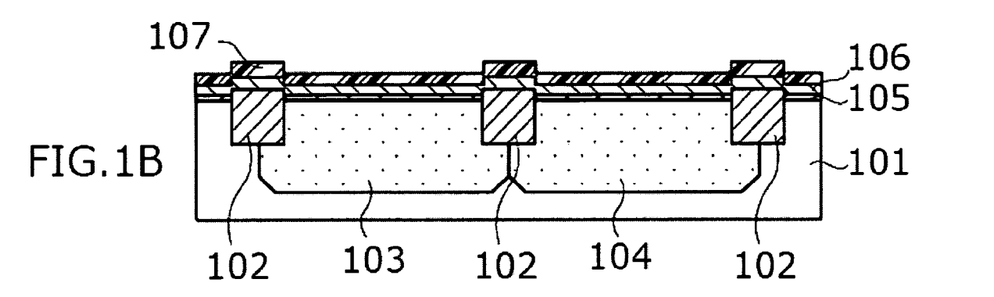

Next, as shown in FIG. 1B, a gate insulating film 105 is formed from, e.g., $SiO_xN_y$, $HfSiO_x$, $HfO_2$, or $HfAl_xO_y$. Further thereon, a TiN film having a thickness of, e.g., about 10 nm is deposited on the entire surface of the wafer as a first electrode metal 106 constituting a gate of the P-MISFET. Mo, $MoN_x$, W or $WN_x$ can be used for the material 106 which is the first electrode metal constituting a gate of the P-MISFET, instead of TiN. Hereafter, the case where TiN is used will be explained as one example. The TiN film 106 can be deposited by techniques such as CVD (chemical vapor deposition), ALD (atomic layer deposition), or reactive sputtering. Further thereon, a metal film 107 for etch mask material is deposited by CVD, ALD, PVD (physical vapor deposition), or other technique.

The gate insulating film 105 used here may contain nitrogen. It is advantageous to contain nitrogen because the dielectric constant can be increased. In this case, the concentration distribution of nitrogen may be varied in the insulating film. For example, the concentration may be such that nitrogen is lower on the substrate side.

The metal film 107 used here is to be made of material resistant to etching when the TiN film 106 is wet etched. Such material includes, for example, Ta, $TaN_x$, V, $VN_x$, Nb, $NbN_x$, $TiSi_x$, $HfSi_x$, $ZrSi_x$, $VSi_x$, $NbSi_x$, $TaSi_x$, $WSi_x$, and $MoSi_x$. The thickness of the metal film 107 should be such that it is not etched via pinholes and the like during wet etching, and preferably set to 10 nm or more.

Figure 1C:
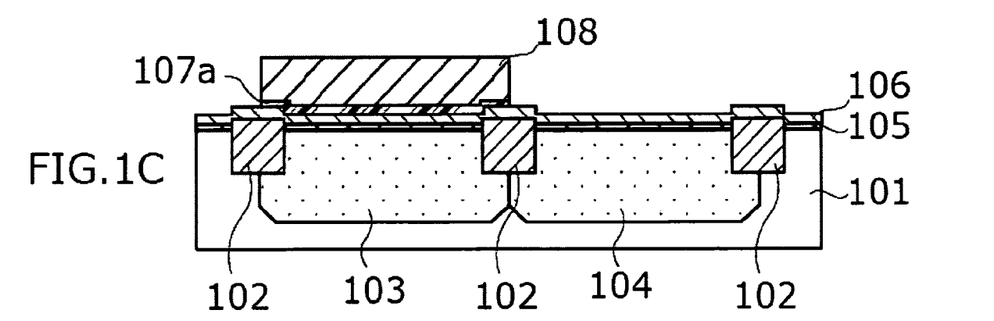

Next, as shown in FIG. 1C, resist or the like is used to form a pattern 108 that covers the N-well region 103. The exposed portion of the metal film 107 for etch mask material is then etched by RIE (reactive ion etching) or other technique.

Figure 1D:
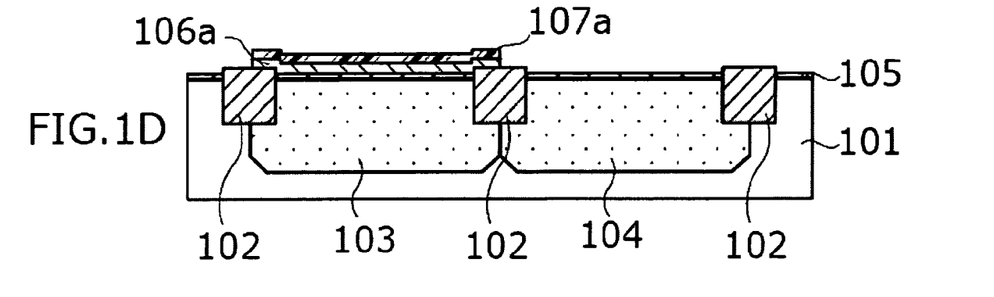

After the pattern 108 is removed, as shown in FIG. 1D, the exposed first electrode metal 106 is removed using a liquid mixture of $H_2O_2$ and $H_2SO_4$ or the like to form a metal film 106A. Besides a liquid mixture of $H_2O_2$ and $H_2SO_4$, a liquid mixture of $H_2O_2$ and HCl, a liquid mixture of $H_2O_2$, $HN_3$, and $H_2O$, or other liquid mixtures can be used as an etchant for this step.

Alternatively, an aqueous solution of $H_2O_2$ can also be used as an etchant for this step. When $H_2O_2$ is used, the TiN film 106 can be etched very softly. Furthermore, use of $H_2O_2$ as etchant can reduce damage to HfSiO, HfSiON, HfON, and the like used for the gate insulating film 105.

Next, as shown in FIG. 2A, a ZrN film 109 having a thickness of, e.g., about 10 nm is deposited on the entire surface of the wafer as a second electrode metal constituting a gate of the N-MISFET by using techniques such as CVD or reactive sputtering. Here, instead of the ZrN film 109, a film of silicide such as $TiSi_x$, $CoSi_x$, $NbSi_x$, $TaSi_x$, $NiSi_x$, $MoSi_x$, or $WSi_x$ may be deposited.

Furthermore, as shown in FIG. 2B, a metal film 110 for decreasing resistance and an insulating film 111 of SiN and the like to serve as a hard mask of the gate are deposited to form a resist pattern 112 for forming a gate electrode.

The metal film 110 used here is preferably made of W, Mo, or the like by using CVD or PVD technique. The thickness thereof is preferably set to 100 nm or less.

While the thickness of the insulating film 111 should be appropriately determined by taking into consideration the etching rate of SiN during etching the gate stack, a film thickness of 100 nm or less is preferable.

Next, as shown in FIG. 2C, a gate electrode 113 is formed by RIE technique.

Next, as shown in FIG. 3, an extension 114 of the P-MISFET and an extension 115 of the N-MISFET are formed in a self-aligned manner with respect to the gate electrode 113.

In the subsequent steps, conventional techniques can be used to form a source/drain and interconnection, thereby producing a MISFET.

The above method illustrates depositing first the metal constituting the gate electrode of the P-MISFET. However, the metal constituting the gate electrode of the N-MISFET may be deposited first.

The method of this embodiment described above allows the number of times of exposing the gate electrode to wet etching chemicals to be limited to only once, which is for removing the first electrode metal. As a result, damage to the gate insulating film can be reduced. Furthermore, in the case of wet etching, high temperature, for example, is not required, which also means low damage to the gate insulating film and the like.

Moreover, since HF etching is not used, a gate insulating film soluble in HF such as SiON or $HfSiO_x$ film can also be used. This also serves to simplify the process because metal films for mask material can be directly used as part of the electrode without being removed.

Second Embodiment

A second embodiment of the invention will now be described.

FIGS. 4 to 8 are process cross-sectional views illustrating the relevant part of a method of manufacturing a semiconductor device according to a second embodiment of the invention.

Figure 4A:
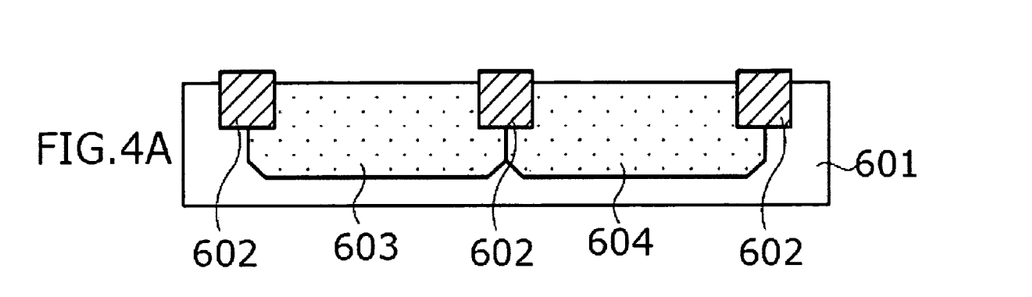
FIGS. 4 to 8 are process cross-sectional views illustrating the relevant part of a method of manufacturing a semiconductor device according to a second embodiment of the invention.

First, as shown in FIG. 4A, a device isolation 602, an N-well region 603, and a P-well region 604 are formed in a silicon substrate 601.

Specifically, the device isolation 602 is formed by oxidizing part of the silicon substrate 601 or by forming a trench and filling it with insulator. The N-well region 603 is then formed by selectively introducing n-type impurities into the surface of the silicon substrate 601, and the P-well region 604 is formed by selectively introducing p-type impurities into the surface of the silicon substrate 601.

Figure 4B:
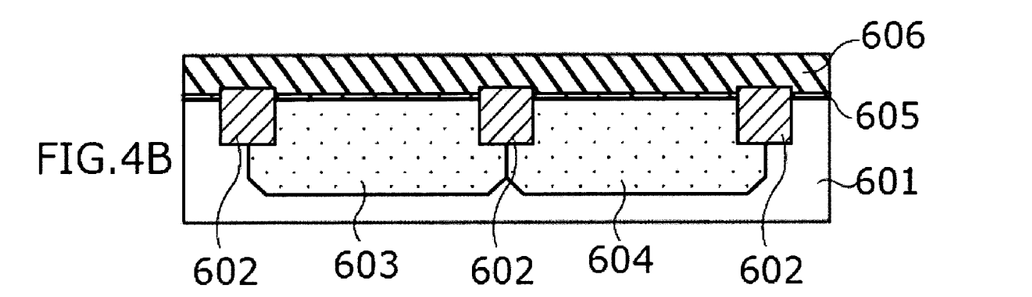

Next, as shown in FIG. 4B, an oxide film 605 of about 5 nm is formed by thermal oxidation or the like. Further thereon is formed a silicon film 606 made of polycrystalline silicon, amorphous silicon, or the like having a thickness of about 100 nm.

Figure 4C:
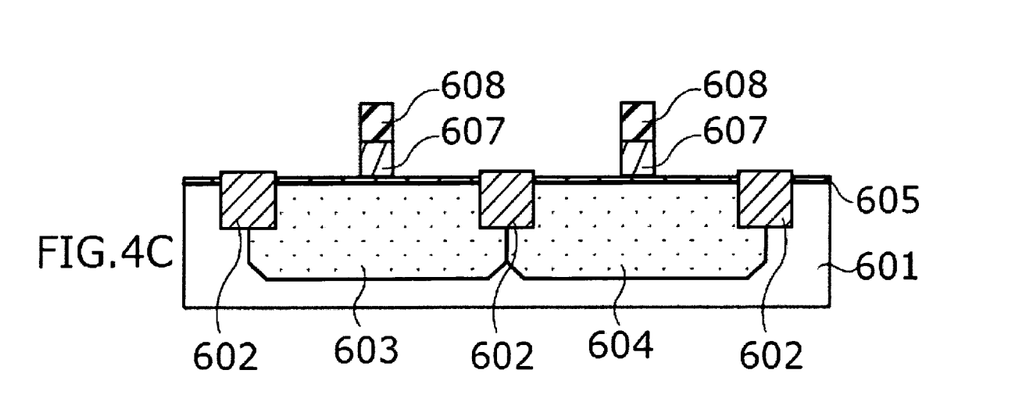

Next, as shown in FIG. 4C, a resist mask 608 is formed by photolithography. This mask is used to etch the silicon film 606 by anisotropic etching such as RIE technique, thereby forming a dummy gate electrode 607.

Figure 5A:
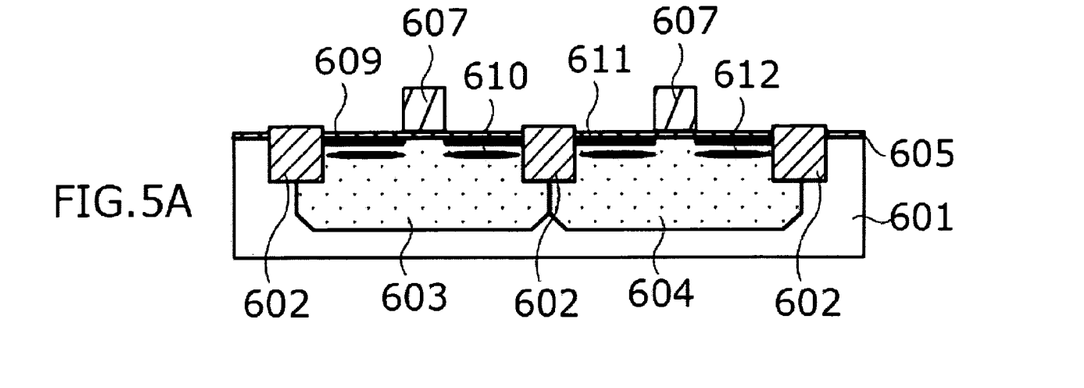

Next, as shown in FIG. 5A, an extension 609 and a halo 610 of a P-MISFET are formed by selectively introducing p-type and n-type impurities, respectively, into the N-well region 603. Likewise, an extension 611 and a halo 612 of an N-MISFET are formed by selectively introducing n-type and p-type impurities, respectively, into the P-well region 604.

Figure 5B:
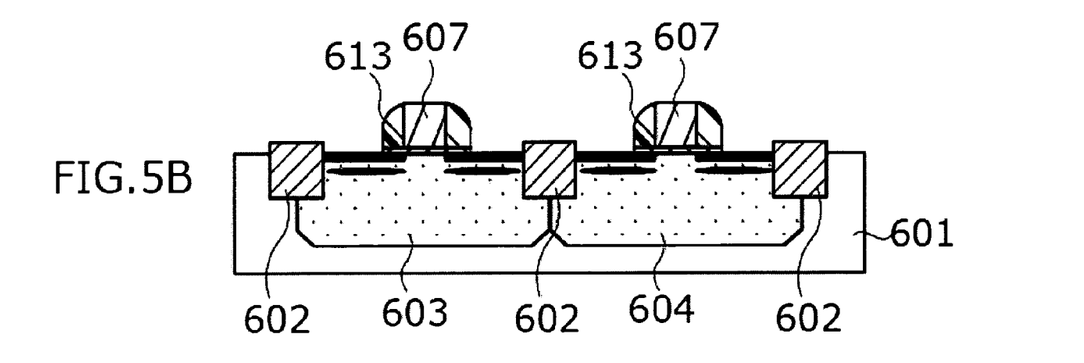

Next, as shown in FIG. 5B, a gate sidewall 613 made of insulating film of SiN and the like is formed. A method for doing this may include depositing a SiN film on the entire surface of the wafer and etching it back by anisotropic etching.

Figure 5C:
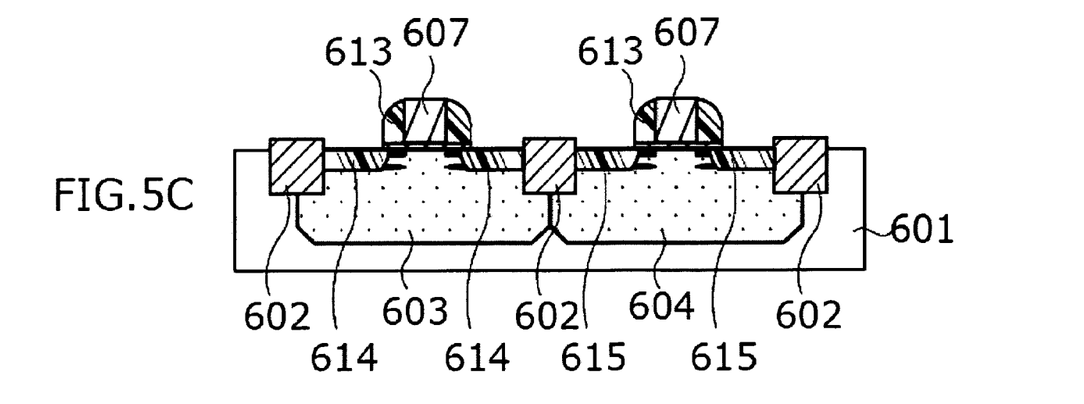

Next, as shown in FIG. 5C, a source/drain 614 of the P-MISFET is formed by selectively introducing p-type impurities into the N-well region 603, and a source/drain 615 of the N-MISFET is formed by selectively introducing n-type impurities into the P-well region 604.

Figure 6A:
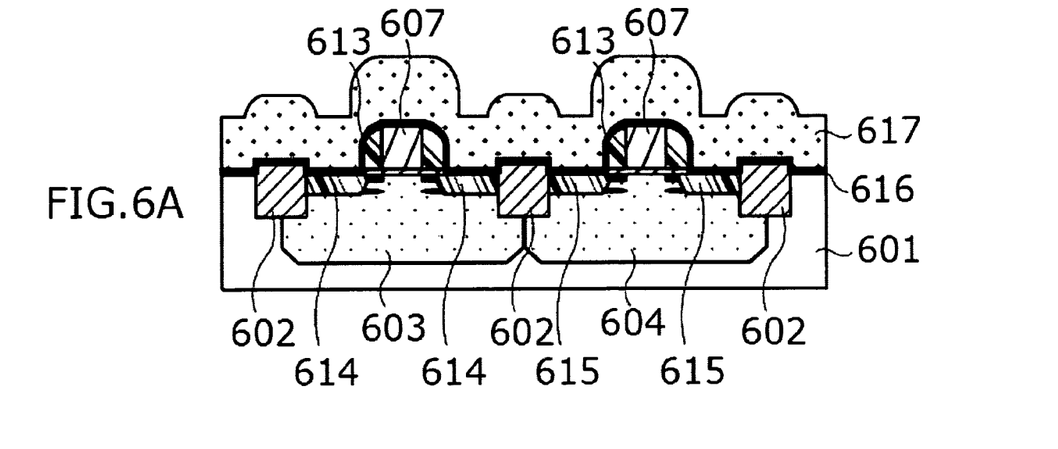

Next, as shown in FIG. 6A, on the substrate surface are deposited an etching stopper film 616 of about 30 to 50 nm made of SiN and the like and a silicon oxide film 617 having a greater film thickness than the dummy gate electrode 607.

Figure 6B:
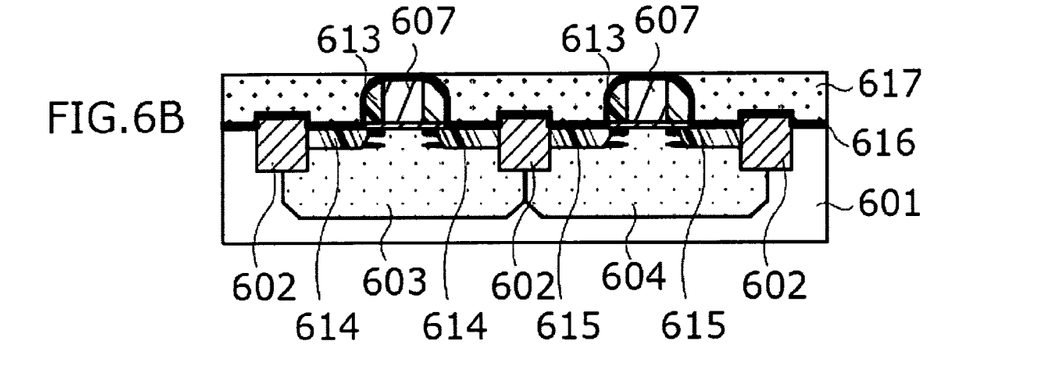

Next, as shown in FIG. 6B, the silicon oxide film 617 is polished by CMP (Chemical Mechanical Polishing) technique. CMP is terminated when the etching stopper film 616 is exposed.

Figure 6C:
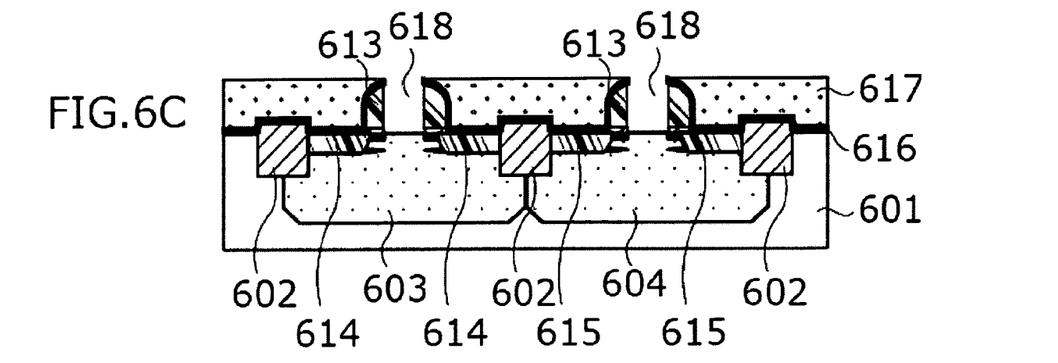

Next, as shown in FIG. 6C, the exposed portion of the etching stopper film, the underlying dummy gate electrode 607, and the underlying thin oxide film 605 are removed to form a gate groove 618. Since the dummy gate electrode 607 is formed from silicon, it can be selectively etched relative to the thin oxide film 605 by RIE technique similar to that used for processing the gate electrode, for example.

Subsequently, the exposed portion of the oxide film 605 is wet etched with HF-containing liquid to expose the silicon substrate at the bottom of the gate groove 618.

Figure 7A:
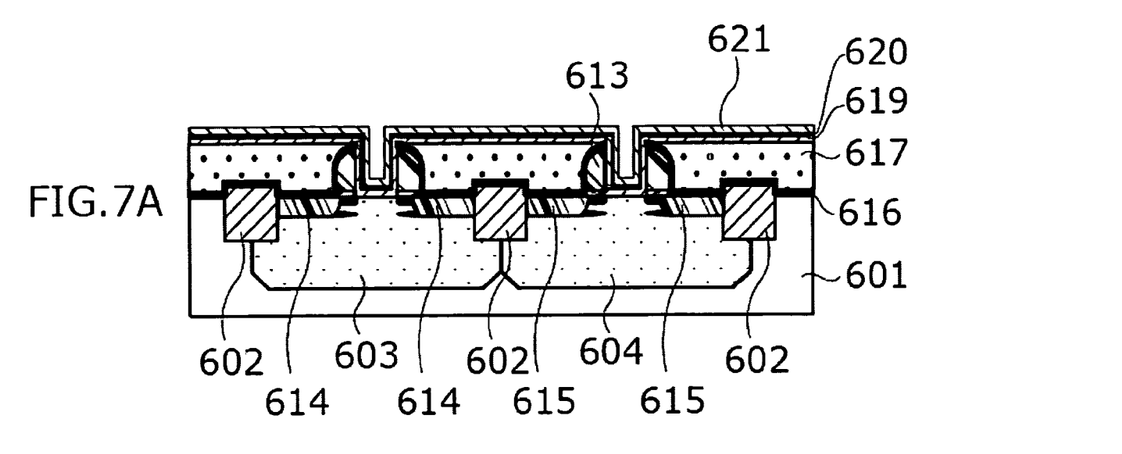

Next, as shown in FIG. 7A, a gate insulating film 619 is formed so as to cover the substrate surface and the inner wall surface of the gate groove 618. The gate insulating film 619 can be made of material such as SiON, $HfSiO_x$, $HfO_2$, or $HfAlO_x$. In obtaining SiON or the like by oxynitridation of the silicon substrate, however, the gate insulating film 619 is formed only in the exposed portion of the silicon substrate at the bottom of the gate groove 618 rather than so as to cover the substrate surface and the inner wall surface of the gate groove 618.

Furthermore, on the gate insulating film 619, a TiN or other film 620 having a thickness of, e.g., about 10 nm is deposited as a first electrode metal constituting a gate of the P-MISFET so as to cover the substrate surface and the inner wall surface of the gate groove 618. Further thereon, a metal film 621 for etch mask material is formed by CVD, ALD, PVD, or other technique.

The metal film 621 used here is made of material that is resistant to etching when the film 620 is wet etched and that can be patterned by being selectively etched relative to the film 620. The metal film 621 may be made of, for example, Ta, $TaN_x$, V, $VN_x$, Nb, $NbN_x$, $TiSi_x$, $HfSi_x$, $ZrSi_x$, $VSi_x$, $NbSi_x$, $TaSi_x$, $WSi_x$, and $MoSi_x$. The thickness thereof should be such that it is not etched via pinholes and the like during wet etching, and desirably set to 10 nm or more.

The film 620 may be other than TiN film as long as it has sufficient selection ratio for etching the film 621, can be selectively wet etched relative to the gate insulating film 619 and the film 621, and has a work function suitable to p-type MISFET, which is desirably 4.6 to 5.2 eV. For example, $ZrN_x$ and $HfN_x$ (x>1.2) satisfy these requirements. Mo, $MoN_x$, W, or $WN_x$ can also be used as the material of the film 620.

Figure 7B:
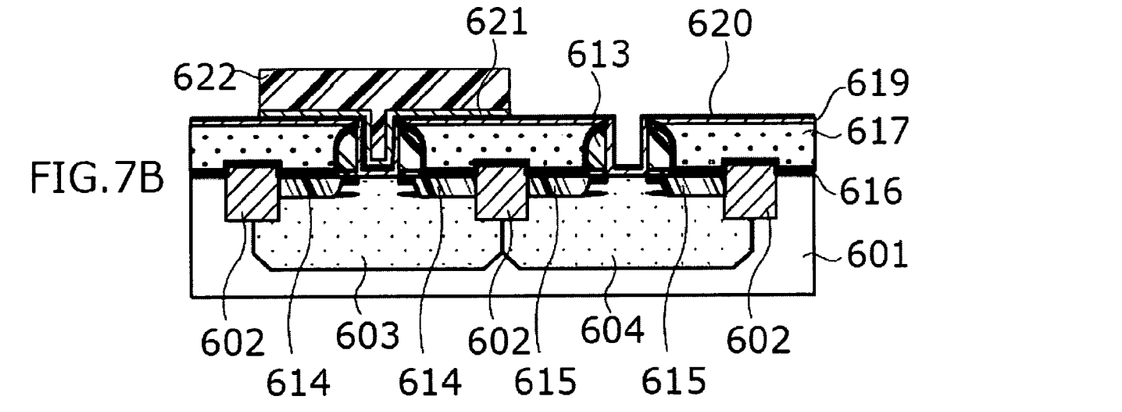

Next, as shown in FIG. 7B, resist or the like is used to form a pattern 622 that covers the N-well region 603. The pattern 622 is used as a mask to selectively etch the film 621 relative to the film 620 by RIE or other technique.

Figure 7C:
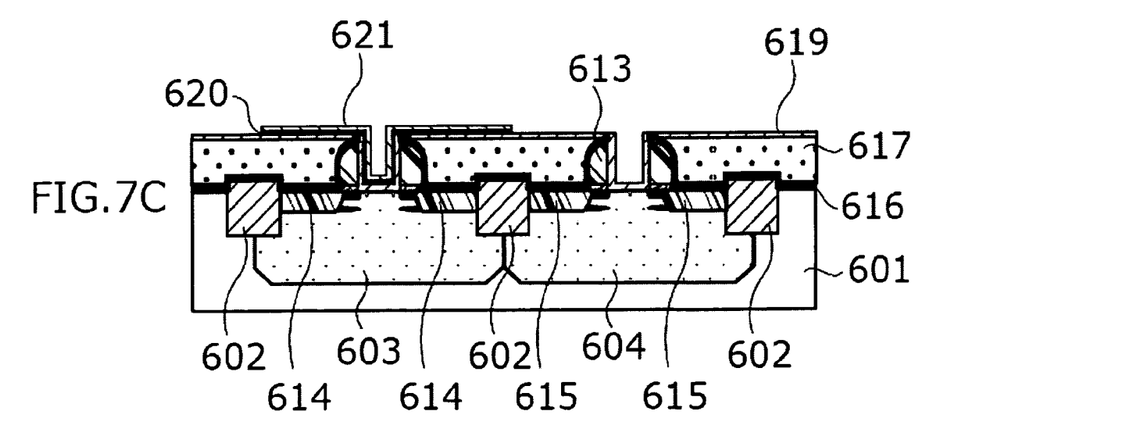

Next, as shown in FIG. 7C, after the pattern 622 is removed, the film 621 is used as a mask to remove the film 620 by using a liquid mixture of $H_2O_2$ and $H_2SO_4$ or the like as an etchant. Besides a liquid mixture of $H_2O_2$ and $H_2SO_4$, a liquid mixture of $H_2O_2$ and HCl, a liquid mixture of $H_2O_2$, $HN_3$, and $H_2O$, or other liquid mixtures can be used as an etchant for this step.

Alternatively, again for this step, an aqueous solution of $H_2O_2$ can also be used as an etchant. When $H_2O_2$ is used, the TiN film 620 can be etched very softly. Furthermore, use of $H_2O_2$ as etchant can reduce damage to HfSiO, HfSiON, HfON, and the like used for the gate insulating film 619.

Figure 8A:
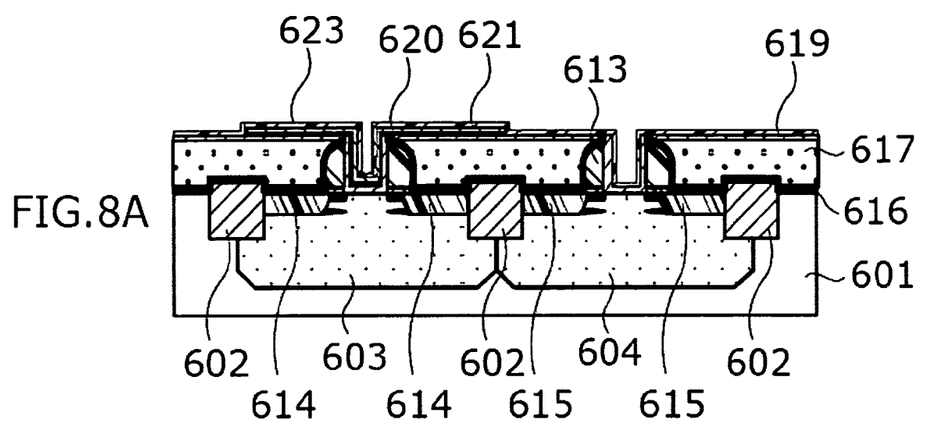

Next, as shown in FIG. 8A, a film 623 having a thickness of, e.g., about 10 nm is formed on the entire surface of the wafer as a second electrode metal constituting a gate of the N-MISFET by using techniques such as CVD, PVD, ALD, or silicidation of silicon with metal. The film 623 may be a $ZrN_x$ ($x \leq 1$) film, a film made of metal silicide such as $TaSi_x$, $TiSi_x$, $WSi_x$, $MoSi_x$, $NiSi_x$, $CoSi_x$, or $NbSi_x$ or a film made of pure metal such as Ta or Nb. The film 623 may be any other film as long as it has a work function suitable to n-type MISFET, which is desirably 4.1 to 4.5 eV.

Figure 8B:
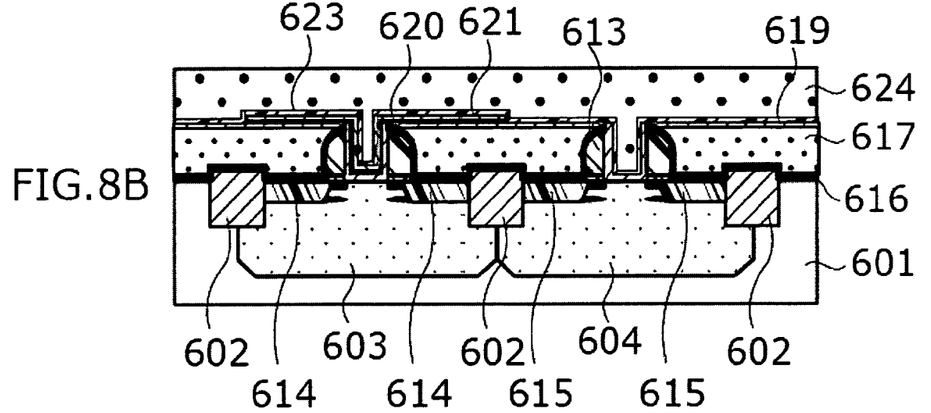

Next, as shown in FIG. 8B, a conductor 624 for decreasing resistance is deposited. The conductor 624 can be formed from conductive material such as metal or silicon, for example.

Figure 8C:
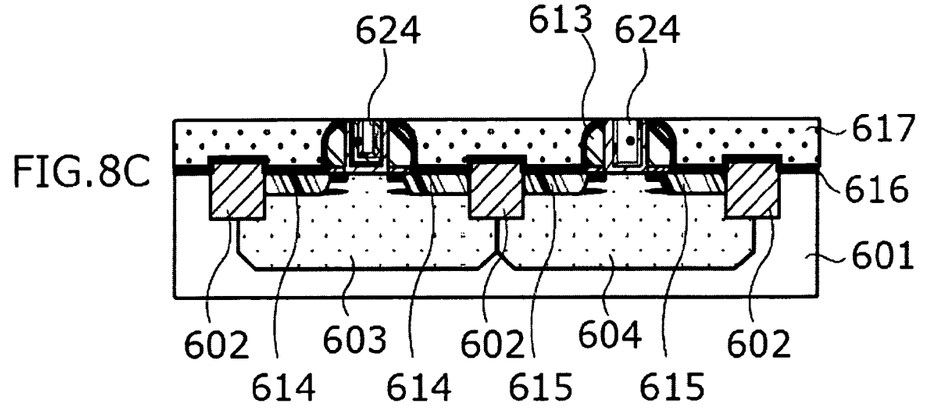

Next, as shown in FIG. 8C, CMP technique is used to remove the gate insulating film 619, the first electrode metal 620 constituting the gate of the P-MISFET, the second electrode metal 623 constituting the gate of the N-MISFET, the metal film 621 serving as etching mask material, and the metal 624 for decreasing resistance that are formed outside the gate groove 618.

After this step, interconnection can be formed to produce a MISFET.

The above method illustrates depositing first the metal constituting the gate electrode of the P-MISFET. On the contrary, however, the metal constituting the gate electrode of the N-MISFET may be deposited first.

As described above, the method of this embodiment allows the number of times of exposing the gate electrode to wet etching chemicals to be limited to only once, which is for removing the first electrode metal. As a result, damage to the gate insulating film can be reduced.

Moreover, since HF etching is not used, a gate insulating film soluble in HF such as SiON or $HfSiO_x$ film can also be used.

This also serves to simplify the process because metal films for mask material can be directly used as part of the electrode without being removed.

Embodiments of the invention have been described with reference to examples.

However, the invention is not limited to these examples. For example, any materials, chemicals, semiconductor structures, and processing conditions used in the method of manufacturing a semiconductor device according to the invention that are appropriately selected from known ranges by those skilled in the art are also encompassed within the scope of the invention.

What is claimed is:

1. A method of manufacturing a semiconductor device comprising:

forming a device isolation, a first conductivity type region, and a second conductivity type region on a semiconductor substrate;

depositing a gate insulating film on the semiconductor substrate;

forming a first metal film on the gate insulating film;

forming a region of a second metal film so as to cover a region that forms a gate electrode of the first conductivity type region;

removing the first metal film exposed outside the region of the second metal film by wet etching to expose the gate insulating film;

forming a third metal film on the second metal film and on the exposed gate insulating film;

depositing a protecting film on the third metal film; and patterning the first metal film, the second metal film, the third metal film, and the protecting film to form the gate electrode.

2. The method of manufacturing a semiconductor device according to claim 1, wherein the gate insulating film is an oxide containing at least one selected from the group consisting of Si, Hf, Zr, and Al.

3. The method of manufacturing a semiconductor device according to claim 2, wherein the gate insulating film contains nitrogen.

4. The method of manufacturing a semiconductor device according to claim 3, wherein the nitrogen has a concentration distribution being lower on the substrate side.

5. The method of manufacturing a semiconductor device according to claim 1, wherein the gate insulating film is any one selected from the group consisting of $SiO_xN_y$, $HfSiO_x$, $HfO_x$, and $HfAl_xO_y$.

6. The method of manufacturing a semiconductor device according to claim 1, wherein the first metal film comprises at least one selected from the group consisting of $TiN_x$, Mo, $MoN_x$, W, and $WN_x$.

7. The method of manufacturing a semiconductor device according to claim 1, wherein the second metal film includes at least one selected from the group consisting of Ta, $TaN_x$, V, $VN_x$, Nb, $NbN_x$, $TiSi_x$, $HfSi_x$, $ZrSi_x$, $VSi_x$, $NbSi_x$, $TaSi_x$, $WSi_x$, and $MoSi_x$.

8. The method of manufacturing a semiconductor device according to claim 1, wherein etching liquid used in the wet etching includes $H_2O_2$.

9. The method of manufacturing a semiconductor device according to claim 1, wherein etching liquid used in the wet etching is an aqueous solution of $H_2O_2$.

10. The method of manufacturing a semiconductor device according to claim 1, wherein etching liquid used in the wet etching is any one of a liquid mixture of $H_2O_2$ and $H_2SO_4$, a liquid mixture of $H_2O_2$ and HCl, and a liquid mixture of $H_2O_2$, $HN_3$, and $H_2O$.

11. A method of manufacturing a semiconductor device comprising:

forming a device isolation; a first conductivity type region, and a second conductivity type region on a semiconductor substrate;

forming a first dummy gate in a region that forms a gate electrode of the first conductivity type and a second dummy gate in a region that forms a gate electrode of the second conductivity type on the semiconductor substrate;

forming gate sidewalls made of insulator on both sides of the first and second dummy gates;

covering the region other than the first and second dummy gates on the semiconductor substrate;

selectively removing the first and second dummy gates with the gate insulating film and the gate sidewalls being covered;

forming a gate insulating film on a surface of the semiconductor substrate exposed by removal of the first and second dummy gates;

forming a first metal film on the gate insulating film;

forming a second metal film on the first metal film;

removing the second metal film in the region having the second dummy gate formed therein while the second metal film is covered in the region having the first dummy gate formed therein;

removing, by wet etching, the first metal film in the region having the second dummy gate formed therein while the first metal film is covered thereon with the second metal film in the region having the first dummy gate formed therein, thereby exposing the gate insulating film;

forming a third metal film at least on the gate insulating film exposed in the region having the second dummy gate formed therein; and removing the first metal film, the second metal film and the third metal film except the regions having the first and second dummy gates formed therein.

12. The method of manufacturing a semiconductor device according to claim 11, wherein the gate insulating film is an oxide containing at least one selected from the group consisting of Si, Hf, Zr, and Al.

13. The method of manufacturing a semiconductor device according to claim 11, wherein the first metal film comprises $TiN_x$.

14. The method of manufacturing a semiconductor device according to claim 11, wherein the second metal film includes at least one selected from the group consisting of Ta, $TaN_x$, V, $VN_x$, Nb, $NbN_x$, $TiSi_x$, $HfSi_x$, $ZrSi_x$, $VSi_x$, $NbSi_x$, $TaSi_x$, $WSi_x$, and $MoSi_x$.

15. The method of manufacturing a semiconductor device according to claim 11, wherein etching liquid used in the wet etching is any one of an aqueous solution of $H_2O_2$, a liquid mixture of $H_2O_2$ and $H_2SO_4$, a liquid mixture of $H_2O_2$ and HCl, and a liquid mixture of $H_2O_2$, $HN_3$, and $H_2O$.

16. A method of manufacturing a semiconductor device including a semiconductor layer having a first conductivity type region and a second conductivity type region formed therein, a gate insulating film formed on the semiconductor layer, a first gate electrode provided on the gate insulating film in the first conductivity type region, and a second gate electrode provided on the gate insulating film in the second conductivity type region, the first gate electrode having a first metal film provided on the gate insulating film and a second metal film provided on the first metal film, and the second gate electrode having a third metal film provided on the gate insulating film, the method comprising:

forming the first metal film on the gate insulating film;

removing, by wet etching, the first metal film in the region where the second gate electrode is formed while the first metal film is covered with the second metal film in the region where the first gate electrode is formed; and forming a third metal film at least in the region where the second gate electrode is formed.

17. The method of manufacturing a semiconductor device according to claim 16, wherein the gate insulating film is an oxide containing at least one selected from the group consisting of Si, Hf, Zr, and Al.

18. The method of manufacturing a semiconductor device according to claim 16, wherein the first metal film comprises at least one selected from the group consisting of $TiN_x$, Mo, $MoN_x$, W, and $WN_x$.

19. The method of manufacturing a semiconductor device according to claim 16, wherein the second metal film includes at least one selected from the group consisting of Ta, $TaN_x$, V, $VN_x$, Nb, $NbN_x$, $TiSi_x$, $HfSi_x$, $ZrSi_x$, $VSi_x$, $NbSi_x$, $TaSi_x$, $WSi_x$, and $MoSi_x$.

20. The method of manufacturing a semiconductor device according to claim 16, wherein etching liquid used in the wet etching is any one of an aqueous solution of $H_2O_2$, a liquid mixture of $H_2O_2$ and $H_2SO_4$, a liquid mixture of $H_2O_2$ and HCl, and a liquid mixture of $H_2O_2$, $HN_3$, and $H_2O$.

* * * * *